(12) United States Patent
Sung et al.

(10) Patent No.: US 10,790,413 B2
(45) Date of Patent: Sep. 29, 2020

(54) SEMICONDUCTOR DEVICE HAVING A LIGHT EMITTING STRUCTURE

(71) Applicant: LG INNOTEK CO., LTD., Seoul (KR)

(72) Inventors: Youn Joon Sung, Seoul (KR); Yong Gyeong Lee, Seoul (KR); Kwang Yong Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 33 days.

(21) Appl. No.: 16/068,600

(22) PCT Filed: Dec. 28, 2016

(86) PCT No.: PCT/KR2016/015364
§ 371 (c)(1),
(2) Date: Jul. 6, 2018

(87) PCT Pub. No.: WO2017/119661
PCT Pub. Date: Jul. 13, 2017

(65) Prior Publication Data
US 2019/0013439 A1 Jan. 10, 2019

(30) Foreign Application Priority Data

Jan. 8, 2016 (KR) .................... 10-2016-0002477

(51) Int. Cl.
*H01L 33/06* (2010.01)
*H01L 33/32* (2010.01)
(Continued)

(52) U.S. Cl.
CPC ............. *H01L 33/32* (2013.01); *H01L 33/20* (2013.01); *H01L 33/36* (2013.01); *H01L 33/58* (2013.01);
(Continued)

(58) Field of Classification Search
CPC ......... H01L 33/06; H01L 33/20; H01L 33/30; H01L 33/36; H01L 33/44; H01L 33/58
See application file for complete search history.

(56) References Cited

U.S. PATENT DOCUMENTS 7,358,522 B2* 4/2008 Yanamoto ............. B82Y 20/00
257/14
9,035,341 B2 5/2015 Hwang et al.
2005/0281303 A1* 12/2005 Horio ..................... H01L 33/08
372/44.01

FOREIGN PATENT DOCUMENTS

JP 2013-098475 5/2013
JP 2013-118331 6/2013
(Continued)

OTHER PUBLICATIONS

International Search Report (with English Translation) and Written Opinion dated Mar. 29, 2017 issued in Application No. PCT/KR2016/015364.

*Primary Examiner* — Hoai V Pham
(74) *Attorney, Agent, or Firm* — Ked & Associates LLP

(57) ABSTRACT

One embodiment comprises: a substrate; a first conductive semiconductor layer disposed on the substrate; a second conductive semiconductor layer disposed on the first conductive semiconductor layer; and an active layer disposed between the first conductive semiconductor layer and the second conductive semiconductor layer, wherein the first conductive semiconductor layer comprises a first area where a partial area of the first conductive semiconductor layer is exposed, and comprises an inclination part which is disposed between the upper surface of the first area and the upper surface of the second conductive semiconductor layer, wherein the inclination part comprises a first edge making contact with the upper surface of the second conductive semiconductor layer, and a second edge making contact with (Continued)

the upper surface of the first area of the first conductive semiconductor layer, wherein the ratio of a first length to a second length is 1:0.87 to 1:4.26, wherein the first length is a length in a first direction between the first edge and the second edge, and the second length is a length in a second direction between the first edge and the second edge, wherein the first direction and the second direction are directions that are perpendicular to each other.

18 Claims, 13 Drawing Sheets

(51) Int. Cl.
*H01L 33/20* (2010.01)
*H01L 33/36* (2010.01)
*H01L 33/58* (2010.01)
*G02F 1/13357* (2006.01)
*H01L 33/44* (2010.01)

(52) U.S. Cl.
CPC ........ *G02F 1/133603* (2013.01); *H01L 33/06* (2013.01); *H01L 33/44* (2013.01)

(56) References Cited

FOREIGN PATENT DOCUMENTS

| | | |
|---|---|---|
| KR | 10-2010-0041138 | 4/2010 |
| KR | 10-1034144 | 5/2011 |
| KR | 10-2011-0128545 | 11/2011 |
| KR | 10-2013-0109319 | 10/2013 |
| KR | 10-2014-0071689 | 6/2014 |
| KR | 10-2015-0121968 | 10/2015 |
| KR | 10-2015-0128424 | 11/2015 |

* cited by examiner

FIG.7A

| H=1[μm] d1[μm] | UNDERCUT OCCURRENCE | θ |
|---|---|---|
| 1.73 | No | 30° |
| 1.15 | No | 41° |
| 1 | No | 45° |
| 0.58 | No | 60° |
| 0.47 | No | 65° |
| 0.36 | Yes | 70° |
| 0.18 | Yes | 80° |

FIG.7B

| H=2[μm] d1[μm] | UNDERCUT OCCURRENCE | θ |
|---|---|---|
| 3.46 | No | 30° |
| 2.3 | No | 41° |
| 2 | No | 45° |
| 1.15 | No | 60° |
| 0.93 | No | 65° |
| 0.73 | Yes | 70° |
| 0.35 | Yes | 80° |

SEMICONDUCTOR DEVICE HAVING A LIGHT EMITTING STRUCTURE

CROSS-REFERENCE TO RELATED PATENT APPLICATIONS

This application is a U.S. National Stage Application under 35 U.S.C. § 371 of PCT Application No. PCT/KR2016/015364, filed Dec. 28, 2016, which claims priority to Korean Patent Application No. 10-2016-002477, filed Jan. 8, 2016, whose entire disclosures are hereby incorporated by reference.

TECHNICAL FIELD

Embodiments relate to a semiconductor device.

BACKGROUND ART

Semiconductor devices including a Group III-V compound such as GaN are in the spotlight as essential materials for semiconductor optical devices such as light emitting diodes (LEDs), light receiving devices, laser diodes (LDs) and solar cells owing to excellent physical and chemical properties thereof.

Nitride semiconductor optical devices are used as light sources of various products such as a backlight of a cellular phone, a keypad, a display board and a lighting apparatus. In particular, as digital products have evolved, demand for nitride semiconductor optical devices with greater luminance and higher reliability has increased.

In addition, when a light receiving device such as a photodetector or a solar cell is manufactured using a semiconductor material of a Group III-V or II-VI compound, with development of device materials, light of various wavelength regions from gammas rays to the radio wavelength band may be utilized by absorbing light of various wavelengths and generating photocurrent. In addition, such a semiconductor device has advantages such as fast response speed, safety, environmental friendliness or easy control of device materials and thus may be easily used for power control or microwave circuit or a communication module.

Accordingly, semiconductor devices are applicable to transmission modules of optical communication means, light emitting diode backlights replacing cold cathode fluorescence lamps (CCFLs) configuring backlights of liquid crystal displays (LCDs), white light emitting diode lighting apparatuses which may replace fluorescent lamps or incandescent lamps, vehicle headlights and traffic lights and sensors for sensing gas or fire. In addition, the semiconductor devices are applicable to high-frequency circuits, other power control apparatuses and communication modules.

DISCLOSURE

Technical Problem

Embodiments provide a semiconductor device capable of securing reliability and suppressing increase in operating voltage.

Technical Solution

In one embodiment, a semiconductor device includes a substrate, a first conductive-type semiconductor layer disposed on the substrate, a second conductive-type semiconductor layer disposed on the first conductive-type semiconductor layer, and an active layer disposed between the first conductive-type semiconductor layer and the second conductive-type semiconductor layer. The first conductive-type semiconductor layer includes a first region in which a portion of the first conductive-type semiconductor layer is exposed, an inclined portion is disposed between an upper surface of the first region and an upper surface of the second conductive-type semiconductor layer, the inclined portion includes a first edge which is in contact with the upper surface of the second conductive-type semiconductor layer and a second edge which is in contact with the upper surface of the first region of the first conductive-type semiconductor layer, a ratio of a first length to a second length is 1:0.87 to 1:4.26, and the first length is a length between the first edge and the second edge in a first direction, the second length is a length between the first edge and the second edge in a second direction, and the first direction and the second direction are perpendicular to each other.

An angle between the inclined portion and the upper surface of the first region at the second edge may be 115° to 139°.

The first length is 0.47 μm to 1.15 μm and the second length may be 1 μm to 2 μm.

The semiconductor device may further include a passivation layer disposed on the inclined portion.

The first length may be 0.93 μm to 1.15 μm.

An angle between the inclined portion and the upper surface of the first region at the second edge may be 115° to 120°.

The first conductive-type semiconductor layer may be n-$Al_yGa_{(1-y)}N$, the second conductive-type semiconductor layer may be p-$Al_xGa_{(1-x)}N$, and the content y of Al in the first conductive-type semiconductor layer may be 0.4 to 0.6.

The semiconductor device may further include a first electrode disposed in the first region of the first conductive-type semiconductor layer, and a second electrode disposed on the second conductive-type semiconductor layer, the first electrode may be spaced apart from the second edge, and the second electrode may be spaced apart from the first edge.

A distance between the second edge and the first electrode may be at least 10 μm and a distance between the first edge and the second edge may be at least 10 μm.

A first internal angle of the inclined portion may be different from a second internal angle of a first side surface including a side surface of the first conductive-type semiconductor layer, a side surface of the active layer and a side surface of the second conductive-type semiconductor layer, and the first side surface may be inclined with respect to the upper surface of the substrate, one end thereof may be in contact with the substrate and the other end thereof may be in contact with the upper surface of the second conductive-type semiconductor layer.

Advantageous Effects

Embodiments can secure reliability and suppress increase in operating voltage.

DESCRIPTION OF DRAWINGS

FIG. 7A is a view showing a first experimental result showing whether or not undercut occurs according to a step difference of an inclined side surface and a distance in a horizontal direction.

FIG. 7B is a view showing a second experimental result showing whether or not undercut occurs according to a step difference of an inclined side surface and a distance in a horizontal direction.

BEST MODE

Figure 1:
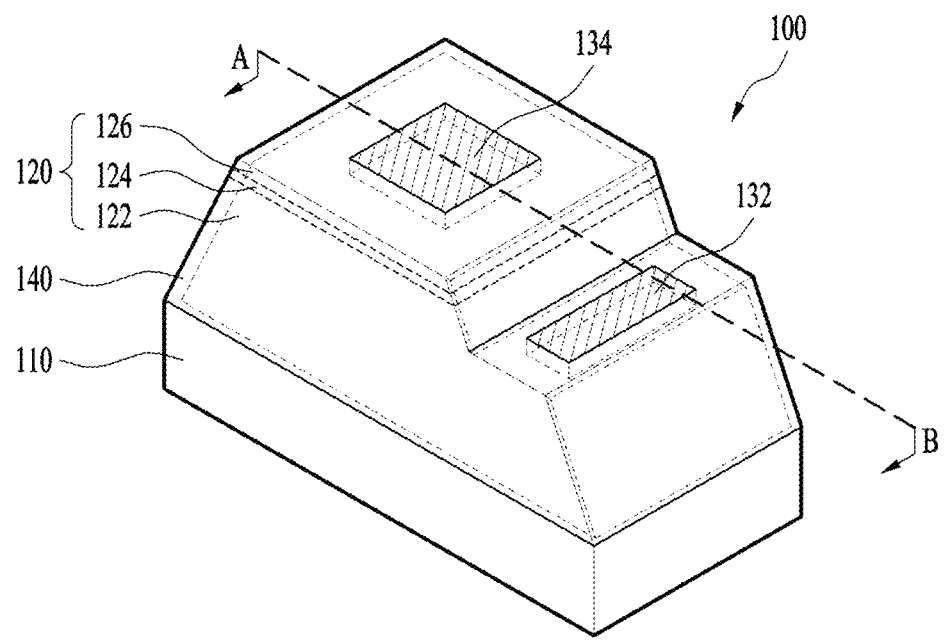
FIG. 1 is a perspective view of a semiconductor device according to an embodiment.

Hereinafter, embodiments will be clearly understood from the annexed drawings and the description associated with the embodiments. In description of the embodiments, it will be understood that when an element, such as a layer (film), a region, a pattern or a structure, is referred to as being "on" or "under" another element, such as a layer (film), a region, a pad or a pattern, the term "on" or "under" means that the element is directly on or under the other element or intervening elements may also be present. It will also be understood that "on" or "under" is determined based on the drawings.

In the drawings, the sizes of elements may be exaggerated, omitted or schematically illustrated for convenience of description and clarity. Further, the sizes of elements do not mean the actual sizes of the elements. Wherever possible, the same reference numbers will be used throughout the drawings to refer to the same parts.

Semiconductor devices may include various electronic devices such as light emitting devices or light receiving devices. Each of the light emitting device and the light receiving device may include a first conductive-type semiconductor layer, an active layer and a second conductive-type semiconductor layer.

For example, the semiconductor device according to the embodiment may be a light emitting device. The light emitting device emits light by recombination of electrons and holes, and the wavelength of the light is determined by an energy band gap inherent to a material. Accordingly, the emitted light may vary depending on the composition of the material.

Figure 2:
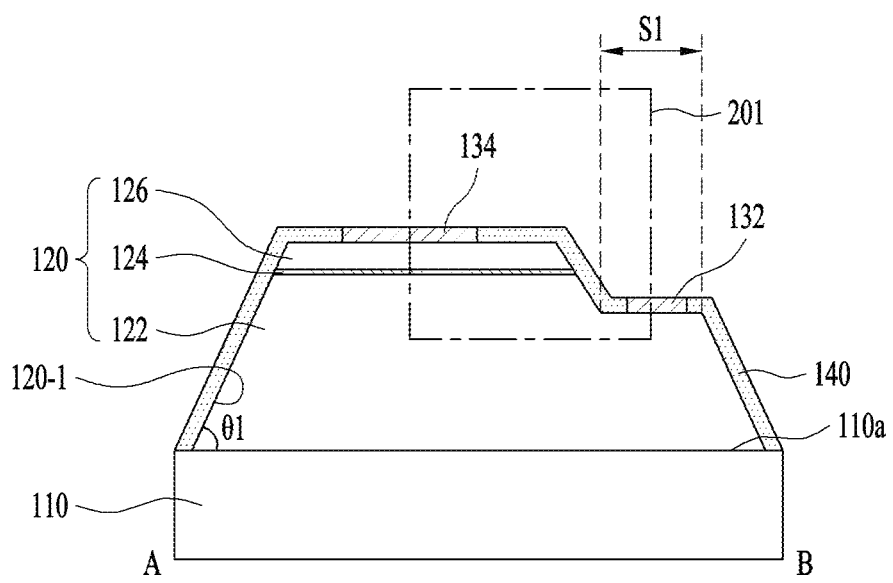
FIG. 2 is a cross-sectional view taken along line A-B of the semiconductor device of FIG. 1.

FIG. 1 is a perspective view of a semiconductor device 100 according to an embodiment, and FIG. 2 is a cross-sectional view taken along line A-B of the semiconductor device 100 of FIG. 1.

Referring to FIGS. 1 and 2, the semiconductor device 100 includes a substrate 110, a light emitting structure 120 disposed on the substrate 110, a first electrode 132 and a second electrode 134 electrically connected to the light emitting structure 120, and a passivation layer 140.

The substrate 110 may be, for example, a sapphire substrate, a silicon (Si) substrate, a zinc oxide (ZnO) substrate or a nitride semiconductor substrate, as a substrate suitable for growing a nitride semiconductor single crystal.

The light emitting structure 120 is disposed on one surface of the substrate 110 and includes a first conductive-type semiconductor layer 122, an active layer 124 and a second conductive-type semiconductor layer 126, all of which are sequentially stacked.

Although not shown in FIGS. 1 and 2, a buffer layer may be disposed between the substrate 110 and the first conductive-type semiconductor layer 122 in order to mitigate lattice mismatch due to a difference in lattice constant between the substrate 110 and the light emitting structure 120. The buffer layer may be formed of a nitride semiconductor including a Group III element and a Group V element. For example, the buffer layer may include at least one of InAlGaN, GaN, AlN, AlGaN and InGaN. The buffer layer may have a single-layer or multi-layer structure and may be doped with a Group II element or a Group IV as impurities.

The first conductive-type semiconductor layer 122 may be formed of a Group III-V or II-VI compound semiconductor and may be doped with a first conductive-type dopant. The first conductive-type semiconductor layer 122 may be formed of a semiconductor having formula of $In_xAl_yGa_{1-x-y}N$ ($0 \leq y \leq 1$, $1 \leq x+y \leq 1$) and may be doped with an n-type dopant (e.g., Si, Ge, Se, Te, etc.).

For example, the first conductive-type semiconductor layer 122 may be n-type $Al_yGa_{(1-y)}N$ and the content y of Al may be 0.4 to 0.6.

The active layer 124 may be disposed between the first conductive-type semiconductor layer 122 and the second conductive-type semiconductor layer 126. The active layer 124 may generate light by energy generated in a process of recombining electrons and holes provided by the first conductive-type semiconductor layer 122 and the second semiconductor layer 126.

The active layer 124 may be formed of a Group III-V or II-VI semiconductor compound, for example, a Group III-V or II-VI compound semiconductor and may have a single well structure, a multi-well structure, a quantum-wire structure, a quantum dot structure or a quantum disk structure.

The active layer 124 may have a formula of $In_xAl_yGa_{1-x-y}N$ ($0 \leq x \leq 1$, $0 \leq y \leq 1$, $0 \leq x+y \leq 1$). For example, if the active layer 124 has a quantum well structure, the active layer 124 may include a well layer (not shown) having a formula of $In_xAl_yGa_{1-x-y}N$ ($0 \leq x \leq 1$, $0 \leq y \leq 1$, $0 \leq x+y \leq 1$), and a barrier layer (not shown) having a formula of $In_aAl_bGa_{1-a-b}N$ ($0 \leq x \leq 1$, $0 \leq y \leq 1$, $0 \leq x+y \leq 1$). The energy band gap of the well layer is lower than that of the barrier layer. The well layer and the barrier layer may be alternately stacked at least once.

The second conductive-type semiconductor layer 126 may be disposed on the active layer 124, may be formed of a Group III-V or II-VI semiconductor compound, and may be doped with a second conductive type dopant.

For example, the second conductive-type semiconductor layer 126 may be formed of a semiconductor having a formula of $In_xAl_yGa_{1-x-y}N$ (($0 \leq x \leq 1$, $0 \leq y \leq 1$, $0 \leq x+y \leq 1$) and may be doped with a p-type dopant (e.g., Mg, Zn, Ca, Sr, or Ba).

For example, the second conductive-type semiconductor layer 126 may be formed of p-type $Al_yGa_{(1-y)}N$.

The light emitting structure 120 may generate light in various wavelength ranges according to the composition of the first conductive-type semiconductor layer, the active layer and the second conductive-type semiconductor layer. For example, the light emitting structure 120 may generate ultraviolet light (e.g., UV-C), without being limited thereto.

The first electrode 132 and the second electrode 134 supply power to the light emitting structure 120. The first electrode 132 is electrically connected to the first conductive-type semiconductor layer 122, and the second electrode 134 is electrically connected to the second conductive-type semiconductor layer 126.

Since the first conductive-type semiconductor layer 122, the active layer 124, and the second conductive-type semiconductor layer 126 are sequentially formed on the substrate 110, in order to directly connect the first electrode 132 to the first conductive-type semiconductor layer 132, a process of exposing a portion of the first conductive-type semiconductor layer 132 is required.

For example, a photoresist pattern is formed on the second conductive-type semiconductor layer 126 by a photolithography process and some portions of the active layer 124 and the second conductive-type semiconductor layer 126 of the light emitting structure 120 are removed using the photoresist pattern as an etching mask, thereby exposing a region (hereinafter referred to as a first region S1) of the first conductive-type semiconductor layer 122 in which the first electrode 132 is disposed.

Figure 3:
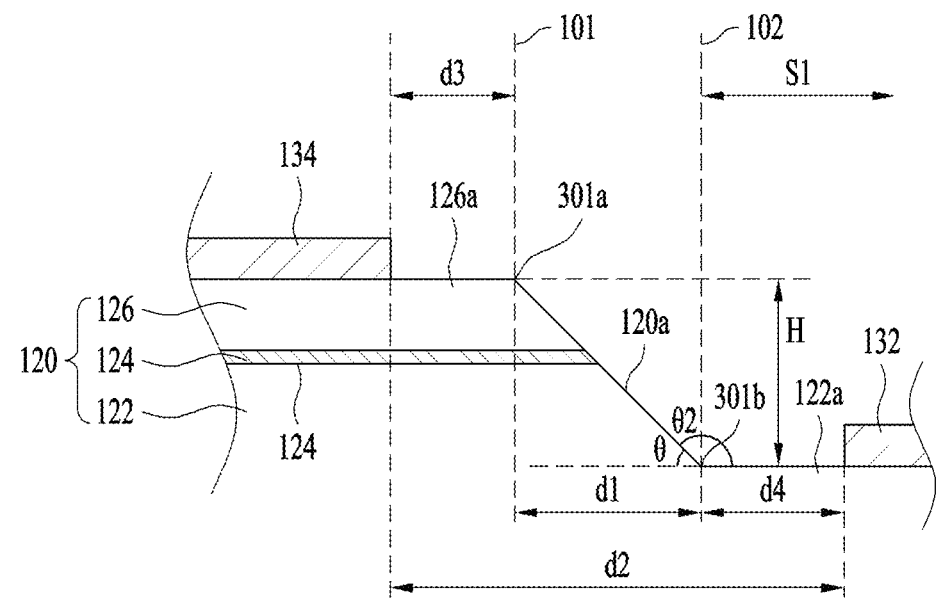
FIG. 3 is an enlarged view of a dotted portion shown in FIG. 2.

FIG. 3 is an enlarged view of a dotted portion 201 shown in FIG. 2. For convenience of description, the passivation layer 140 of FIG. 2 is omitted in FIG. 3.

Referring to FIG. 3, the first region S1 is located below the lower surface 124a of the active layer 124 and may have a step difference H with the upper surface 126a of the second conductive-type semiconductor layer 126. For example, the step difference H may be a height difference between the first region S1 and the upper surface 126a of the second conductive-type semiconductor layer 126 with respect to the upper surface 110a of the substrate 110. Alternatively, the step difference H may be a distance between the first region S1 and the upper surface 126a of the second conductive-type semiconductor layer 126 in a vertical direction.

The first region S1 may be parallel to the upper surface 126a of the second conductive-type semiconductor layer 126 or the upper surface 110a of the substrate 110, without being limited thereto.

An inclined side surface 120a is disposed between the upper surface 126a of the second conductive-type semiconductor layer 126 and the first region S1 of the first conductive-type semiconductor layer 122. The term inclined side surface may be replaced with a stepped surface or an inclined portion.

One end 301a of the inclined side surface 120a is a first edge which meets the upper surface 126a of the second conductive-type semiconductor layer 126, and the other end 301b of the inclined side surface 120a may be a second edge which meets the first region S1 of the first conductive-type semiconductor layer 122.

For example, the first edge may be a boundary portion where the upper surface 126a of the second conductive-type semiconductor layer 126 and one end of the inclined side surface 120a meet, and the second edge may be a boundary portion where the other end 301b of the inclined side surface 120a and the first region S1 of the first conductive-type semiconductor layer 122 meet.

A ratio of the first length d1 to the second length H of the inclined side surface 120a may be 1:0.87 to 1:4.26. The first length d1 may be a length between the first edge 301a and the second edge 301b in a first direction, and the second length H may be a length between the first edge 301a and the second edge 301b in a second direction. The first direction and the second direction may be perpendicular to each other.

For example, the first length d1 may be 0.47 µm to 1.15 µm, and the second length H may be 1 µm to 2 µm.

For example, the height difference or step difference H between the first region S1 and the upper surface 126a of the second conductive-type semiconductor layer 126 with respect to the upper surface 110a of the substrate 110 may be 1 µm to 2 µm. In addition, the distance d1 between the first edge 301a of the inclined side surface 120a and the second edge 301b of the inclined side surface 120a in the horizontal direction may be 0.47 µm to 1.15 µm. For example, the internal angle θ of the inclined side surface 120a based on the first region S1 of the first conductive-type semiconductor layer 122 or the upper surface 111 of the substrate 110 may be 41° to 65°.

Here, the distance d1 in the horizontal direction may be a shortest distance between a first reference line 101 and a second reference line 102. The first reference line 101 may be perpendicular to the upper surface of the substrate 110 and may be a virtual straight line passing through the first edge 301a, and the second reference line 102 may be perpendicular to the upper surface of the substrate 110 and may be a virtual straight line passing through the second edge 301b.

For example, an angle η2 between the inclined side surface 120a and the upper surface of the first region S1 at the second edge 301b may be 115° to 139°.

If the distance d1 of the inclined side surface 120a in the horizontal direction is less than 0.47 µm, undercut occurs in the inclined side surface 120a and the passivation layer 140 does not completely surround the inclined side surface 120a due to undercut, thereby deteriorating reliability of the semiconductor device and causing short circuit failure. In addition, the degree of roughness of the inclined side surface 120a is increased due to undercut, resulting in low-current failure.

If the distance of the inclined side surface 120a in the horizontal direction exceeds 1.15 µm, the distance d2 between the first electrode 132 and the second electrode 134 is increased, thereby increasing the operating voltage of the semiconductor device 100 and reducing luminous efficiency.

Figure 5:
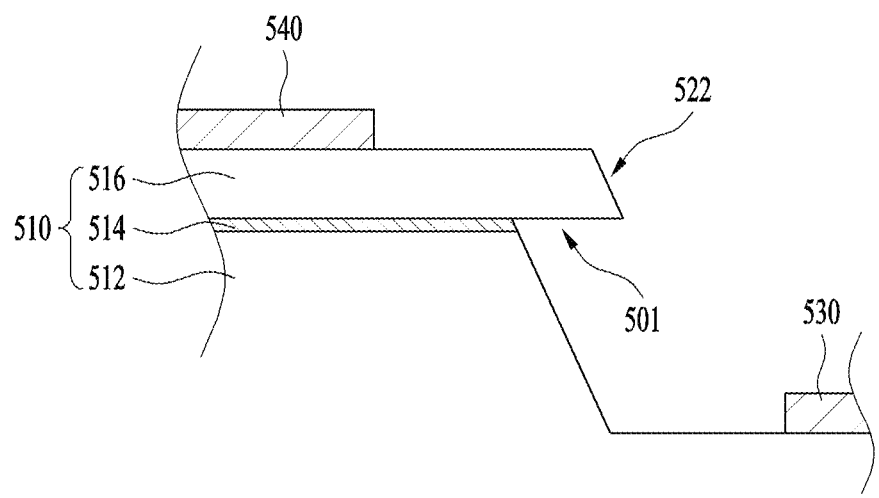
FIG. 5 is a view showing undercut occurring in an inclined side surface.

FIG. 5 is a view showing undercut 501 occurring in an inclined side surface 522.

FIG. 5 shows a light emitting structure 510 including a first conductive-type semiconductor layer 512, an active layer 514 and a second conductive-type semiconductor layer 516.

For direct contact between the first electrode 530 and the first conductive-type semiconductor layer 512, the light emitting structure 510 may be selectively removed by a photolithography process and an etching process, thereby exposing the first region of the first conductive semiconductor layer 512. By such an etching process, the side surface of the light emitting structure 510 may have an inclined side surface 522.

The first electrode 530 may be disposed in the first region of the first conductive-type semiconductor layer 512 and the second electrode 540 may be disposed on the second conductive-type semiconductor layer 516.

The undercut 501 having a stepped structure having two or more steps may occur in the inclined side surface 522 by the photolithography process and the etching process. For example, two-step undercut may occur in the inclined side surface 522 in the process of etching an AlGaN-based light emitting structure for generating UV-C.

Figure 6:
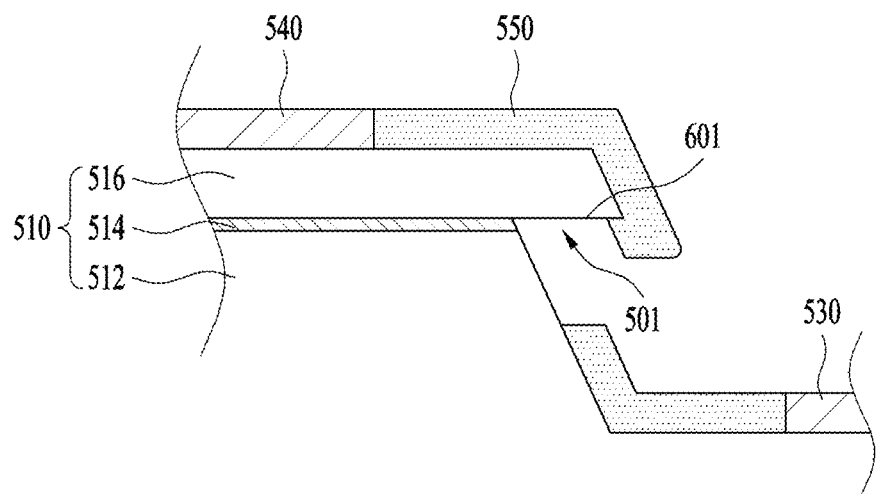
FIG. 6 is a view showing a passivation layer formed on a surface of the inclined side surface shown in FIG. 5.

FIG. 6 is a view showing a passivation layer 550 formed on a surface of the inclined side surface 522 shown in FIG. 5.

Referring to FIG. 6, when the passivation layer 550 is deposited on the inclined side surface 522, the passivation layer 550 is not formed on the surface of the undercut 501 of the inclined side surface 522 and thus the portion of the undercut 501 of the inclined side surface 522 may be exposed from the passivation layer 550. The portion 601 of the inclined side surface 522 exposed from the passivation layer 550 is not insulated by the passivation layer 550, thereby deteriorating reliability of the semiconductor device.

According to embodiments, it is possible to suppress occurrence of undercut by controlling the height H of the inclined side surface 120a and the distance d1 of the inclined side surface 120a in the horizontal direction and to prevent deterioration in reliability of the semiconductor device and low-current failure due to undercut.

FIG. 7A is a view showing a first experimental result showing whether or not undercut occurs according to a step difference H of an inclined side surface 120a and a distance d1 in a horizontal direction. In FIG. 7A, H is 1 μm.

Referring to FIG. 7A, when d1 is 0.47 μm to 1.73 μm, undercut does not occur. In contrast, when d1 is equal to or less than 0.36 μm, undercut occurs in the inclined side surface 120a.

When d1 exceeds 1.15, the distance d2 between the first electrode 132 and the second electrode 134 increases, thereby increasing the operating voltage of the semiconductor device 100 and reducing luminous efficiency.

In order to simultaneously prevent occurrence of undercut in the inclined side surface 120a and increase in operating voltage of the semiconductor device 100, the distance d1 of the inclined side surface 120a in the horizontal direction according to the embodiment may be 0.47 μm to 1.15 μm, and the internal angle θ of the inclined side surface 120a may be 41° to 65°.

FIG. 7B is a view showing a second experimental result showing whether or not undercut occurs according to a step difference H of an inclined side surface and a distance d1 in a horizontal direction. In FIG. 7B, H is 2 μm.

Referring to FIG. 7B, when d1 is 0.93 μm to 3.46 μm, undercut does not occur. In contrast, when d1 is equal to or less than 0.73 μm, undercut occurs in the inclined side surface 120a.

When d1 exceeds 1.15 μm, the distance d2 between the first electrode 132 and the second electrode 134 increases, thereby increasing the operating voltage of the semiconductor device 100 and reducing luminous efficiency.

In order to simultaneously prevent occurrence of undercut in the inclined side surface 120a and increase in operating voltage of the semiconductor device 100, in FIG. 7B, the distance d1 of the inclined side surface 120a in the horizontal direction according to the embodiment may be 0.93 μm to 1.15 μm, and the internal angle θ of the inclined side surface 120a may be 60° to 65°. In addition, for example, the angle θ2 between the inclined side surface 120a and the upper surface of the first region S1 at the second edge 301b may be 115° to 120°.

FIGS. 8A to 8E are views showing whether or not undercut occurs in the inclined side surface 120 according to an internal angle θ of the inclined side surface 120a.

Figure 8A:
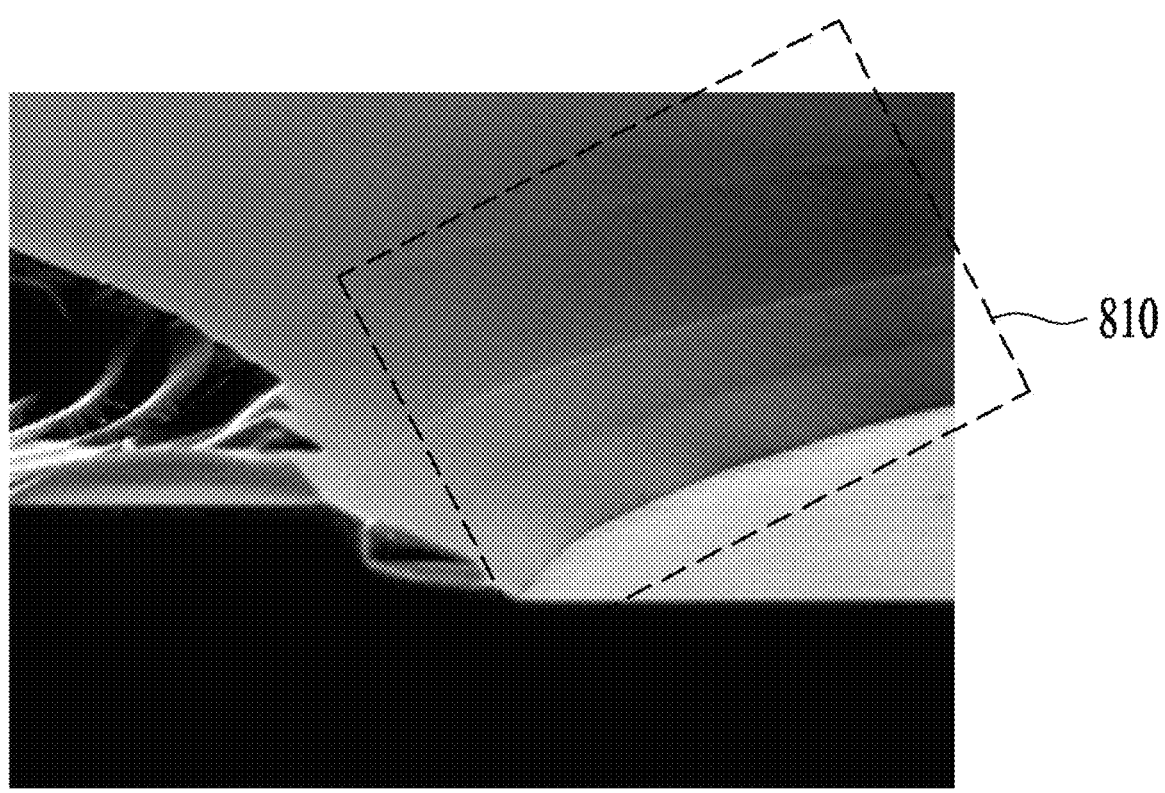
FIGS. 8A to 8E are views showing whether or not undercut occurs in the inclined side surface according to an internal angle of the inclined side surface.
Figure 8B:
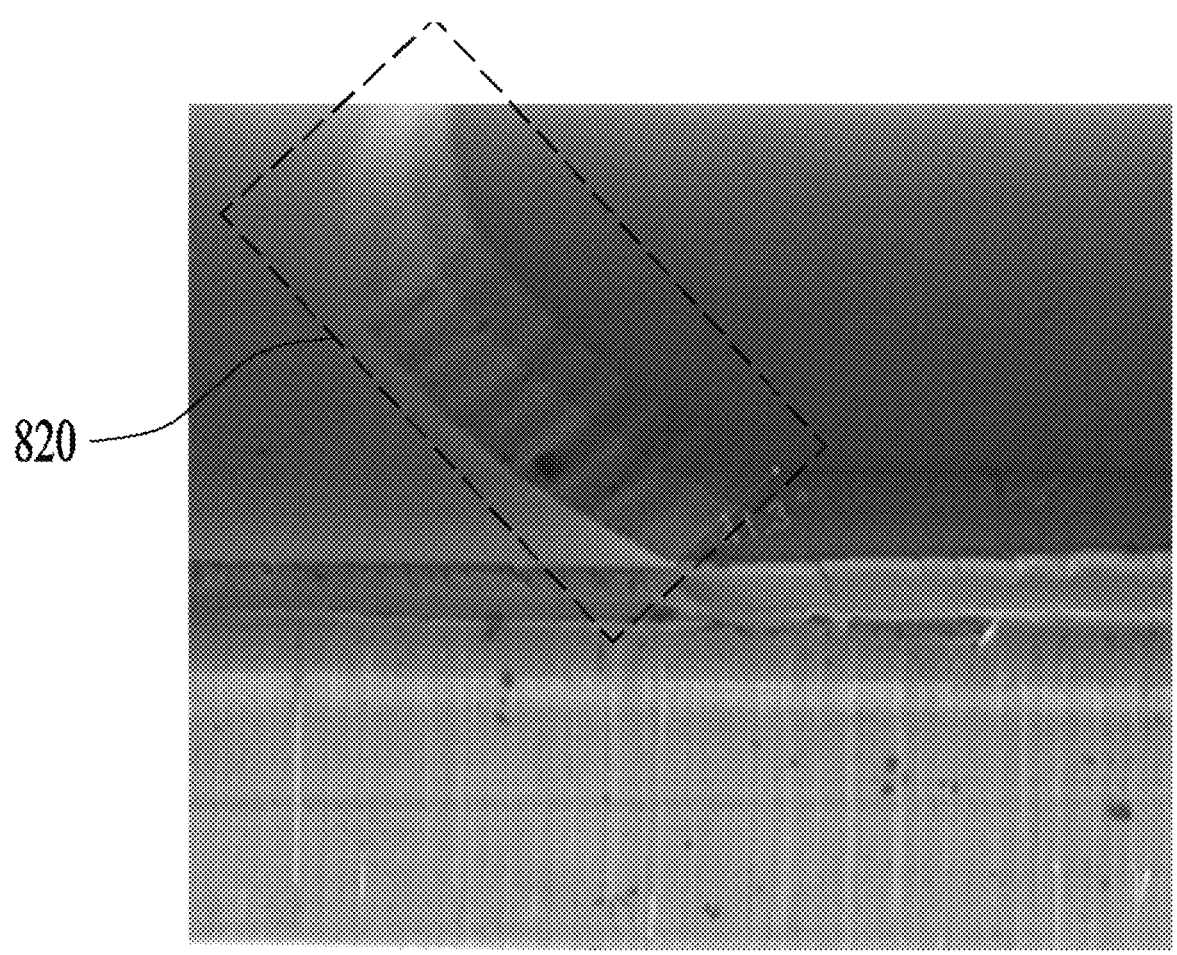
Figure 8C:
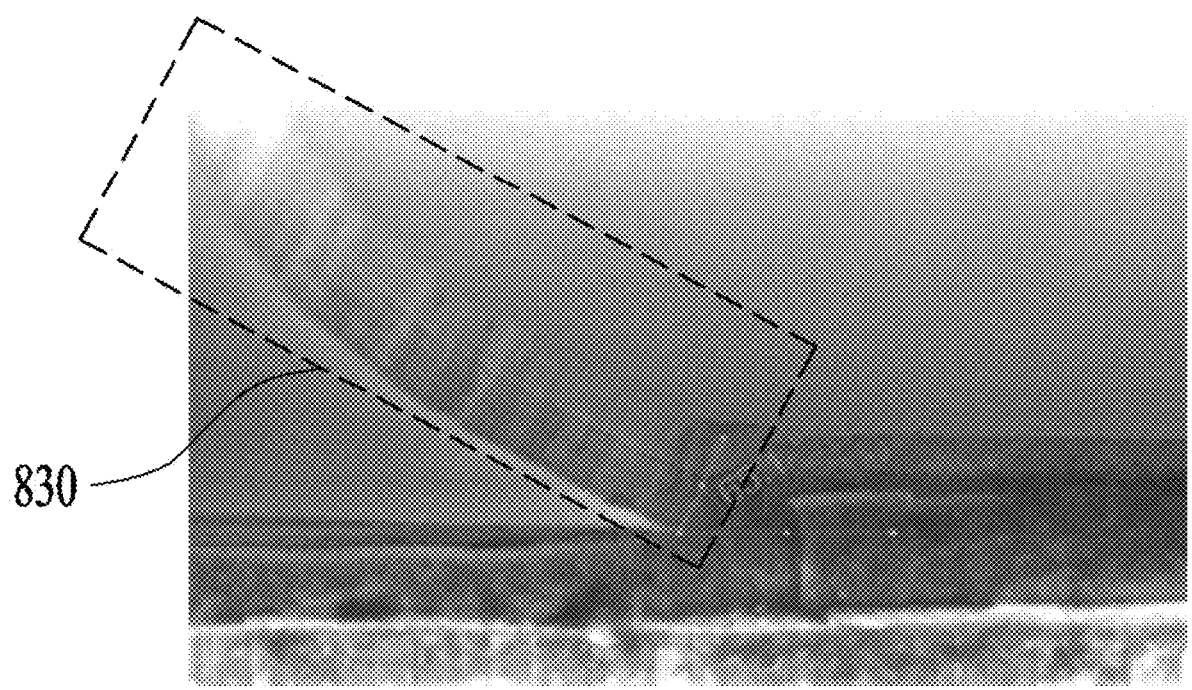
Figure 8D:
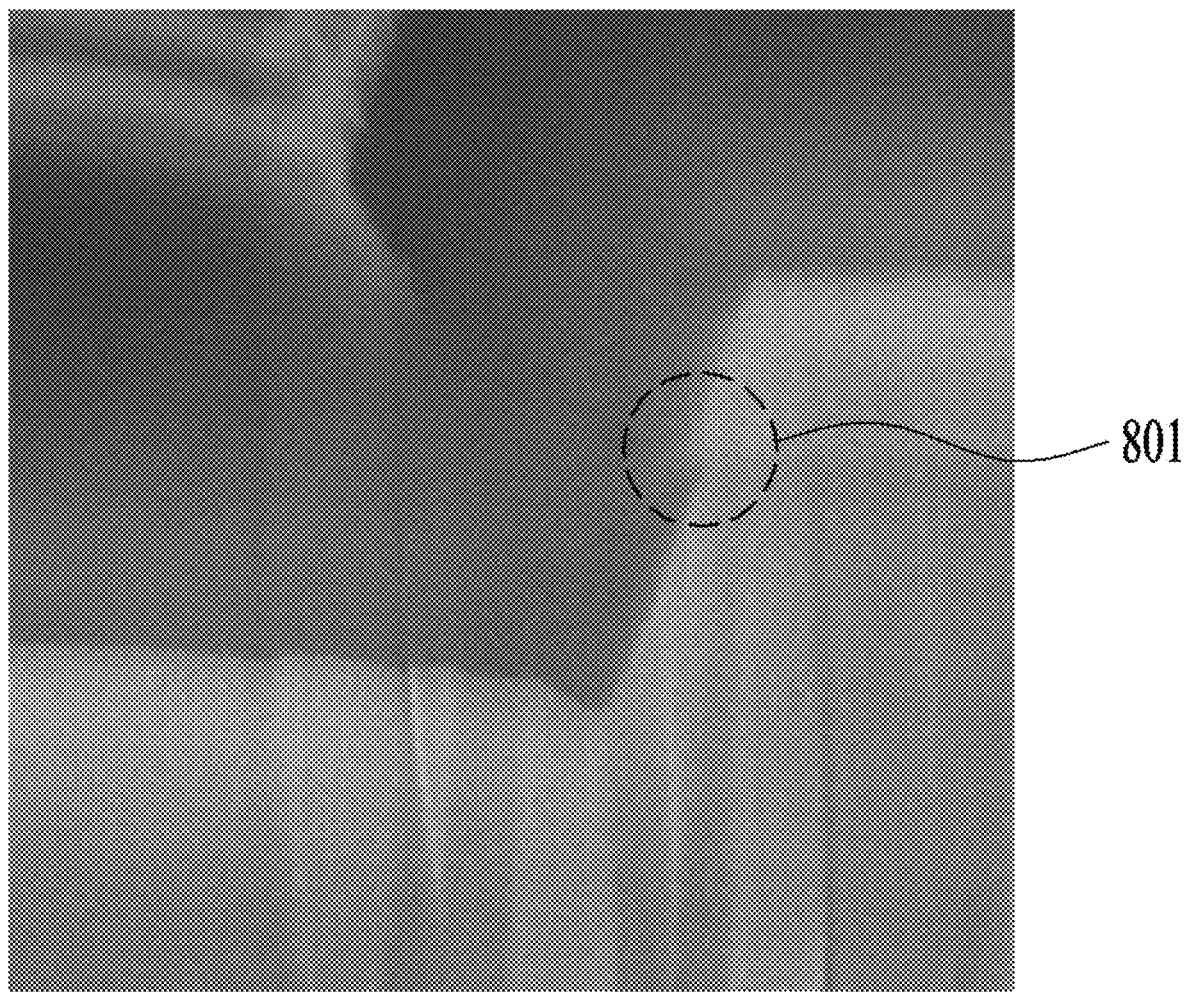
Figure 8E:
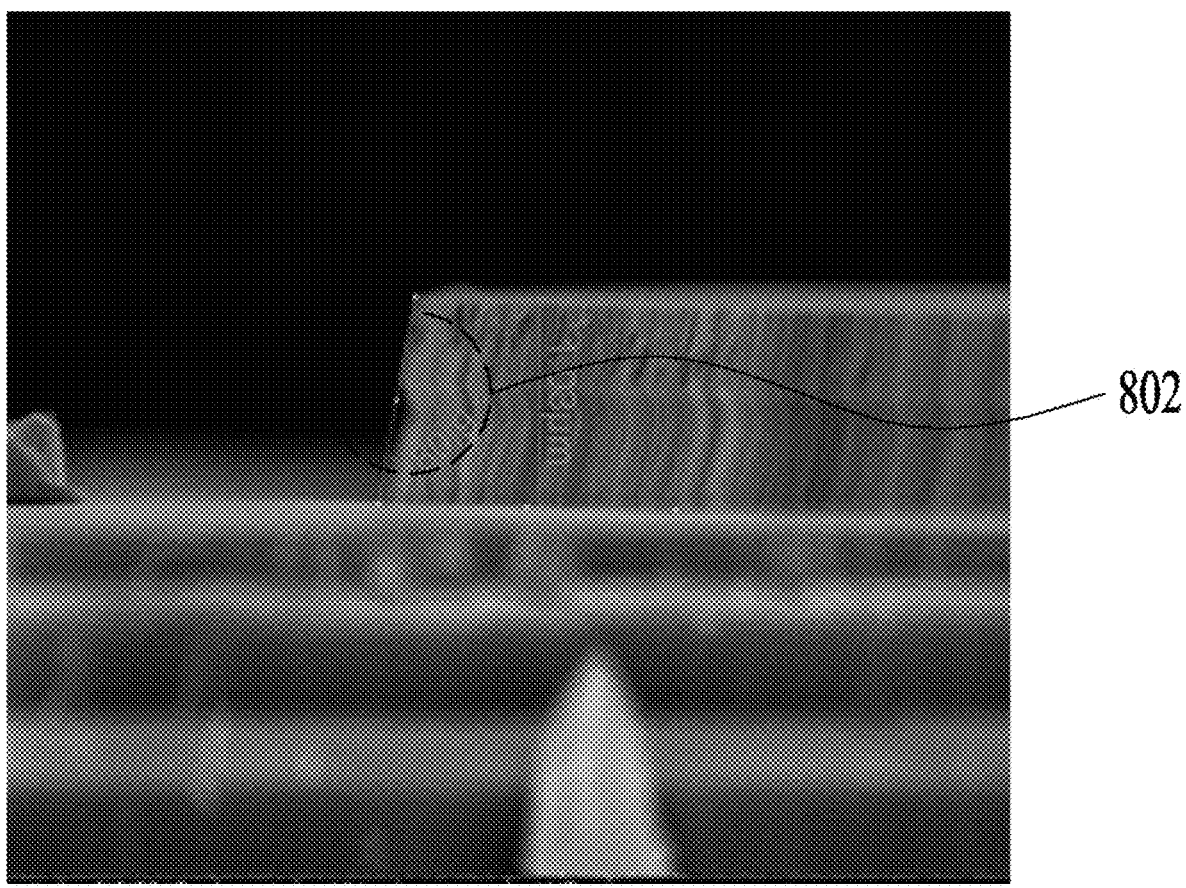

FIG. 8A shows the case where the internal angle θ of the inclined side surface 120a is 31°, FIG. 8B shows the case where the internal angle θ of the inclined side surface 120a is 41°, FIG. 8C shows the case where the internal angle θ of the inclined side surface 120a is 65°, FIG. 8D shows the case where the internal angle θ of the inclined side surface 120a is 70°, and FIG. 8E shows the case where the internal angle θ of the inclined side surface 120a is 80°.

Undercut does not occur in the inclined side surface of FIG. 8A, the inclined side surface 820 of FIG. 8B, and the inclined side surface 830 of FIG. 8C. In contrast, undercut 801 occurs in the inclined side surface of FIG. 8D and undercut 802 occurs in the inclined side surface of FIG. 8E.

Undercut does not occur in the inclined side surface 120a when the internal angle θ of the inclined side surface 120a is 31° to 65°, whereas undercut occurs in the inclined side surface 120a when the internal angle θ of the inclined side surface 120a is 70° and 80°.

When the internal angle θ of the inclined side surface 120a is less than 41°, the distance between the first electrode 530 and the second electrode 540 increases, thereby increasing the operating voltage of the semiconductor device and reducing luminous efficiency. Therefore, the internal angle θ of the inclined side surface 120a according to the embodiment may be 41° to 65°.

In another embodiment, H may be 0.6 μm to 1 μm, and d1 may be 0.27 μm to 1.15 μm.

For example, in another embodiment, H may be 0.6 μm, and d1 may be 0.27 μm to 0.69 μm. When H is 0.6 μm, if d1 is less than 0.27 μm, undercut occurs in the inclined side surface, thereby deteriorating reliability of the semiconductor device.

In another embodiment, H may be 0.8 μm, and d1 may be 0.37 μm to 0.92 μm. When H is 0.8 μm, if d1 is less than 0.37 μm, undercut occurs in the inclined side surface, thereby deteriorating reliability of the semiconductor device.

In another embodiment, H may be 1 μm, and d1 may be 1.15 μm. When H is 1 μm, if d1 exceeds 1.15 μm, the operating voltage of the semiconductor device increases.

In another embodiment, H may be 1.5 μm, and d1 may be 0.69 μm to 1.15 μm. When H is 1.5 μm, if d1 is less than 0.69 μm, undercut occurs in the inclined side surface, thereby deteriorating reliability of the semiconductor device. If d1 exceeds 1.15 μm, the operating voltage of the semiconductor device increases.

In another embodiment, H may be 1.8 μm and d1 may be 0.83 μm to 1.15 μm. When H is 1.8 μm, if d1 is less than 0.83 μm, undercut occurs in the inclined side surface, thereby deteriorating reliability of the semiconductor device. If d1 exceeds 1.15 μm, the operating voltage of the semiconductor device increases.

For alignment margin for patterning, the distance d4 between the second edge 301b of the inclined side surface 120a and the first electrode 132 may be at least 10 μm, and the distance d3 between the first edge 301a of the inclined side surface 120a and the second electrode 134 may be at least 10 μm.

The distance d2 between the first electrode 134 and the second electrode 132 in the horizontal direction may be obtained by summing d1, d3 and d4.

For example, when H=1 μm, the distance d2 between the first electrode 134 and the second electrode 132 in the horizontal direction may be 20.47 μm to 21.15 μm.

When d2 is less than 20.47 μm, undercut occurs in the inclined side surface, thereby deteriorating reliability of the semiconductor device. If d1 exceeds 21.15 μm, the operating voltage of the semiconductor device increases.

For example, when H=2 μm, the distance d2 between the first electrode 134 and the second electrode 132 in the horizontal direction may be 20.93 μm~21.15 μm.

When d2 is less than 20.93 μm, undercut occurs in the inclined side surface, thereby deteriorating reliability of the semiconductor device. If d1 exceeds 21.15 μm, the operating voltage of the semiconductor device increases.

For example, when H is 0.6 µm, 0.8 µm, 1.5 µm or 1.8 µm, d2 may be obtained by adding d3 and d4 to d1.

The passivation layer 140 is disposed on the side surface of the light emitting structure 120 and the inclined side surface 120a, in order to electrically protect the light emitting structure 120.

For example, the passivation layer 140 may cover the side surface of the first conductive-type semiconductor layer 122, the side surface of the active layer 124, the side surface of the second conductive-type semiconductor layer 126, and the inclined side surface 120a. In addition, the passivation layer 140 may cover a portion of the upper surface of the second conductive-type semiconductor layer 126 except for a region in which the second electrode 134 is disposed. The passivation layer 140 may be formed of a light-transmitting insulating material, such as $SiO_2$, SiO, $SiO_xN_y$, $Si_3N_4$, or $Al_2O_3$, without being limited thereto.

Since undercut does not occur in the inclined side surface 120a according to the embodiment, the passivation layer 140 does not expose at least a portion of the inclined side surface 120a, thereby improving electrical reliability of the semiconductor device.

The side surface of the light emitting structure 120 may be inclined by an isolation process for division into chips and the internal angle θ of the inclined side surface 120a of the light emitting structure 120 may be different from the internal angle θ of the side surface 120-1 of the light emitting structure 120. Here, the side surface of the light emitting structure 120 is inclined with respect to the upper surface of the substrate 110, one end thereof is in contact with the substrate 110 and the other end thereof may be in contact with the upper surface of the second conductive-type semiconductor layer 126.

For example, the first internal angle of the inclined side surface 120a may be different from the second internal angle of the first side surface including the side surface of the first conductive-type semiconductor layer 122, the side surface of the active layer 124, and the side surface of the second conductive-type semiconductor layer 126. For example, the first side surface may be inclined with respect to the upper surface of the substrate 110, one end thereof may be in contact with the substrate 110, and the other end thereof may be in contact with the upper surface of the second conductive-type semiconductor layer 126.

Figure 4:
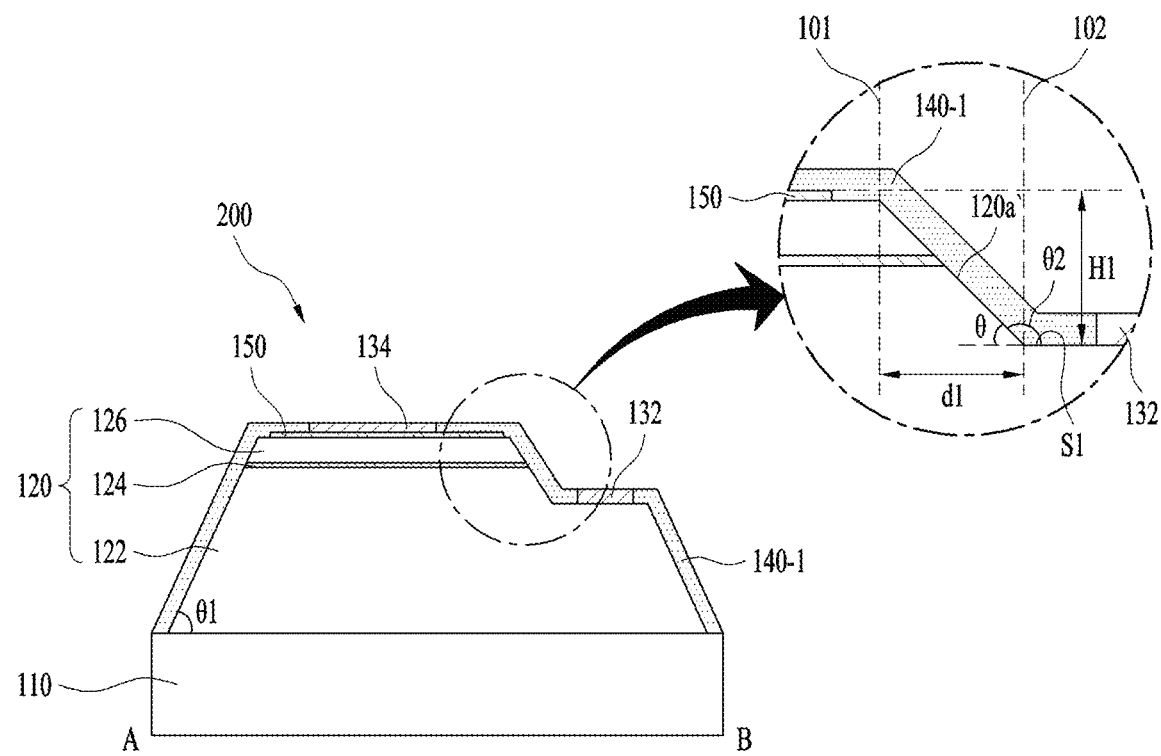
FIG. 4 is a cross-sectional view of a semiconductor device according to another embodiment.

FIG. 4 is a cross-sectional view of a semiconductor device according to another embodiment.

Referring to FIG. 4, the semiconductor device 200 may further include a conductive layer 150 as compared to the semiconductor device 100 shown in FIG. 1.

The conductive layer 150 is disposed on the second conductive-type semiconductor layer 126 and not only reduce total reflection but also has excellent light transmittance, such that extraction efficiency of light emitted from the active layer 124 to the second conductive-type semiconductor layer 126 can be increased.

The conductive layer 150 may be formed in a single layer or multiple layers using transparent conductive oxide such as one or more of ITO (Indium Tin Oxide), TO (Tin Oxide), IZO (Indium Zinc Oxide), ITZO (Indium Tin Zinc Oxide), IAZO (Indium Aluminum Zinc Oxide), IGZO (Indium Gallium Zinc Oxide), IGTO (Indium Gallium Tin Oxide), AZO (Aluminum Zinc Oxide), ATO (Antimony tin Oxide), GZO (Gallium Zinc Oxide), IrOx, RuOx, RuOx/ITO, Cr, Ti, Al, Au, Ni, Ag, Ni/IrOx/Au, or Ni/IrOx/Au/ITO.

The second electrode 134 may be disposed on the conductive layer 150.

The passivation layer 140 may be disposed on a portion of the upper surface of the second conductive-type semiconductor layer 126 as shown in FIG. 2, or the passivation layer 140-1 may be disposed on the side surface of the light emitting structure 120, on the inclined side surface 120a' and in one region of the upper surface of the conductive layer 150 as shown in FIG. 4.

The relationship between d1 and H described with reference to FIGS. 2, 3, 7A, 7B, and 8A to 8E and the description of θ and θ2 are equally applicable to the embodiment of FIG. 4.

The step difference H1 shown in FIG. 4 may be a distance between the first region S1 and the upper surface of the conductive layer 150 in a vertical direction and, in another embodiment, H1 shown in FIG. 4 may be replaced with H of FIGS. 2 and 3. When H1 shown in FIG. 4 is replaced with H of FIGS. 2 and 3, the relationship between d1 and H described with reference to FIGS. 2, 3, 7A, 7B, and 8A to 8E and the description of θ and θ2 are equally applicable.

Figure 9:
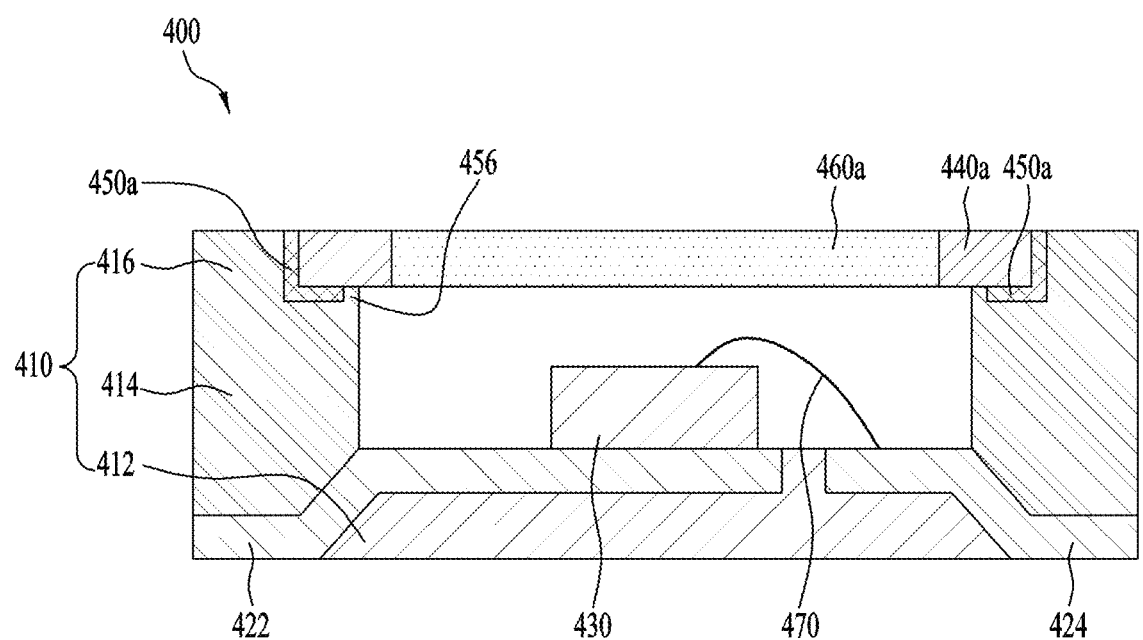
FIG. 9 is a cross-sectional view showing a semiconductor device package according to an embodiment.

FIG. 9 is a cross-sectional view showing a semiconductor device package 400 according to an embodiment.

Referring to FIG. 9, the semiconductor device package 400 includes a package body 410, first and second conductive layers 422 and 424, a semiconductor device 430, an ultraviolet blocking member 440a, an adhesive member 450a, an optical member 460a and a wire 470.

The package body 410 supports and accommodates the first and second conductive layers 422 and 424, the semiconductor device 430, the ultraviolet blocking member 440a, the adhesive member 450, the optical member 460a and the wire 470.

The package body 410 may be formed of a material which is not discolored or damaged by ultraviolet, such as a single-layer or multilayer ceramic. For example, the package body 410 may be implemented using a high temperature co-fired ceramic (HTCC) or a low temperature co-fired ceramic (LTCC).

Alternatively, the package body 410 may include an insulating material of nitride or oxide, such as SiO2, SixOy, Si3N4, SiOxNy, Al2O3 or AlN.

The package body 410 may include a cavity including side surfaces and a bottom. For example, the shape of the cavity of the package body 410 when viewed from the top may be circular, polygonal or elliptical, without being limited thereto.

In addition, the package body 410 may include a lower end 412, a wall 414 and an upper end 416, and the lower end 412, the wall 414 and the upper end 416 may form the cavity of the package body 410. Here, the lower end 412, the wall 414 and the upper end 416 may be integrally formed of the same material or may be individually formed of different materials and then coupled.

The first and second conductive layers 422 and 424 may be disposed in the package body 410 to be spaced apart from each other, and a portion of the package body 410 may be disposed between the first and second conductive layers 422 and 424 such that the first and second conductive layers 422 and 424 are electrically insulated from each other. The first and second conductive layers 422 and 424 may be replaced with the term first and second lead frames.

For example, the first and second conductive layers 422 and 424 may be disposed on the lower end 412 of the package body 410 and the wall 414 may be disposed in the edge regions of the first and second conductive layers 422 and 424.

The upper surface of each of the first and second conductive layers 422 and 424 may be exposed by the cavity of the package body 410 and one end of each of the first and second conductive layers 422 and 424 may be exposed through the package body 410. One end of each of the first and second conductive layers 422 and 424 may be bent in order to improve airtightness for moisture permeation prevention and adhesion with the package body 410.

The upper end of the side surface of the cavity of the package body 410 may have a bent portion or a stepped portion in which the optical member 460a is seated, and the bent portion may be provided with a protrusion 456 for fixing or supporting the optical member 460a.

The wall 414 of the package body 410 may be disposed at the edge of the upper surface of the lower end 412 to surround the semiconductor device 430 disposed on the first conductive layer 422.

The wall 414 of the package body 410 may be spaced apart from the semiconductor device 430 by a predetermined interval or may be disposed on the edge of the upper surface of the lower end 112 of the package body 410 to surround the semiconductor device 430 in a circular or polygonal shape and the shape thereof is not limited thereto.

The upper end 416 of the package body 410 is disposed on the upper surface of the wall 414 to guide the optical member 460a. For example, the upper end 416 of the package body 410 may be disposed at the edge of the upper surface of the wall 114 to surround the side surfaces of the optical member 560, thereby guiding the optical member 460a. The shape of the upper end 416 of the package body 410 may be equal to that of the wall 414 and may be circular or polygonal, without being limited thereto.

The upper surface of the wall 414 of the package body 410 may support the ultraviolet blocking member 440a. For example, the ultraviolet blocking member 44a0 may be disposed on the upper surface of the wall 414. In addition, the adhesive member 450a may be disposed between the upper surface of the wall 414 of the package body 410 and the lower surface of the ultraviolet blocking member 440a and between the inner side surface of the upper end 416 and one side surface of the ultraviolet blocking member 440a.

The semiconductor device 430 may be disposed on the upper surface of the first conductive layer 422 exposed by the cavity and may be electrically connected to the first and second conductive layers 422 and 424. The semiconductor device 430 may be the above-described embodiment 100 or 200 and may be bonded to the upper surface of the first conductive layer 422 by die bonding.

The wire 470 electrically connects the semiconductor device 430 to at least one of the first and second conductive layers 422 and 424. In another embodiment, the semiconductor device 430 may be electrically connected to the first and second conductive layers 422 and 424 through die bonding such as paste bonding, flip chip bonding and eutectic bonding.

The ultraviolet blocking member 440a is disposed in the bent portion provided in the upper end 416 of the package body 410 to prevent ultraviolet light generated by the semiconductor device 430 from being radiated to the adhesive member 450a.

For example, the ultraviolet blocking member 440a may protrude from the inner side surface of the wall 414.

The ultraviolet blocking member 440a may be formed of glass which does not transmit UV. In addition, the ultraviolet blocking member 440a may be formed of an inorganic material which does not transmit UV, such as aluminum, copper, an aluminum alloy or a copper alloy.

The adhesive member 450a may be disposed between the ultraviolet blocking member 440a and the bent portion of the side surface of the cavity of the package body 410, and may be responsible for attaching the ultraviolet blocking member 440a to the side surface of the cavity of the package body 410.

The adhesive member 450a may be formed of an adhesive material for adhering the ultraviolet blocking member 440a to the package body 410, such as an organic material.

For example, the adhesive member 450a may be a UV bond which is a UV curing adhesive. The UV bond refers to a liquid adhesive which is solidified into a solid adhesive in a short time by reaction of a photoinitiator contained in the liquid adhesive with ultraviolet light when the liquid adhesive is irradiated with ultraviolet light.

The optical member 460a is disposed above the semiconductor device 430 and the edge of the optical member 460a is fused and coupled to one end of the ultraviolet blocking member 440a. The optical member 460a transmits ultraviolet light received from the semiconductor member 460a.

For example, the optical member 460a may take the form of a plate or sheet to pass UVC having a wavelength of 200 nm to 280 nm and may be formed of glass or fused silica.

According to another embodiment, a display apparatus, an indicator or a lighting system including the semiconductor device or the semiconductor device package according to the above-described embodiments may be implemented and, for example, the lighting system may include a lamp or a streetlamp.

Figure 10:
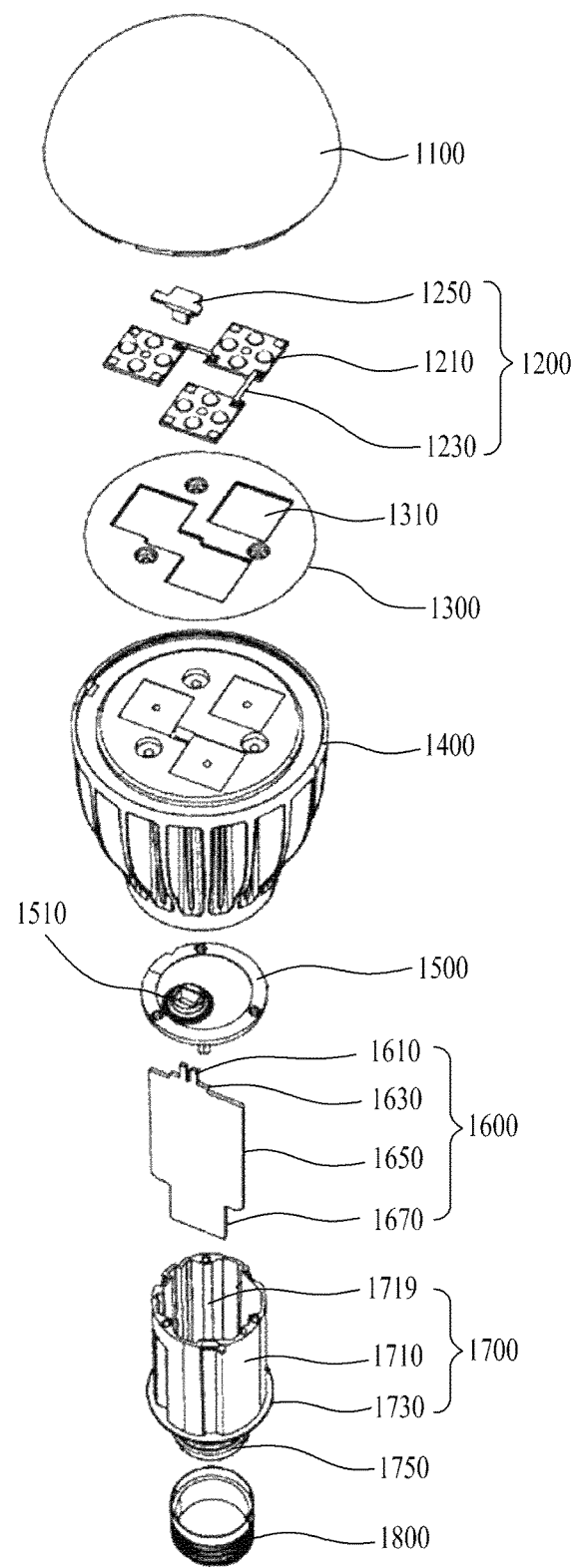
FIG. 10 is a view showing a lighting apparatus according to an embodiment.

FIG. 10 is a view showing a lighting apparatus according to an embodiment.

Referring to FIG. 10, the lighting apparatus may include a cover 1100, a light source module 1200, a heat dissipator 1400, a power supply 1600, an inner case 1700 and a socket 1800. In addition, the lighting apparatus according to the embodiment may further include one or more of a member 1300 and a holder 1500.

The cover 1100 may have a bulbous or a hemispherical shape, the inside thereof may be hollow and a portion thereof may be opened. The cover 1100 may be optically coupled with the light source module 1200. For example, the cover 1100 may diffuse, scatter or excite light received from the light source module 1200. The cover 1100 may be an optical member. The cover 1100 may be coupled with the heat dissipator 1400. The cover 1100 may have a coupling portion coupled with the heat dissipator 1400.

The inner surface of the cover 1100 may be coated with an ivory pigment. The ivory white pigment may include a diffusing agent for diffusing light. The surface roughness of the inner surface of the cover 110 may be larger than that of the outer surface of the cover 1100, in order to sufficiently scatter and diffuse light from the light source module 1200 and emit light to the outside.

The material of the cover 1100 may be glass, plastic, polypropylene (PP), polyethylene (PE) or polycarbonate (PC). Here, polycarbonate has excellent light resistance, heat resistance and strength. The cover 1100 may be transparent such that the light source module 1200 is visible from the outside, without being limited thereto. The cover may be opaque. The cover 1100 may be formed by blow molding.

The light source module 1200 may be disposed on one surface of the heat dissipator 1400 and heat generated by the light source module 1200 may be conducted to the heat dissipator 1400. The light source module 1200 may include light source units 1210, connection plates 1230 and a connector 1250. Each light source unit 1210 may include the semiconductor device 100 or 200 according to the embodiment or the semiconductor device package of FIG. 9.

The member 1300 may be disposed on the upper surface of the heat dissipator 1400 and may have guide grooves 1310, into which the plurality of light source units 1210 and the connector 1250 are inserted. The guide grooves 1310 may correspond to or be aligned with the substrates of the light source units 1210 and the connector 1250.

A light reflecting material may be applied to or coated on the surface of the member 1300.

For example, a white pigment may be applied to or coated on the surface of the member 1300. Such a member 1300 may reflect light, which has been reflected by the inner surface of the cover 1100 and has returned toward the light source module 1200, toward the cover 1100 again. Accordingly, it is possible to improve luminous efficiency of the lighting apparatus according to the embodiment.

The member 1300 may be formed of an insulating material, for example. The connection plates 1230 of the light source module 1200 may include an electrically conductive material. Accordingly, electrical contact between the heat dissipater 1400 and the connection plates 1230 may occur. The member 1300 may be formed of an insulating material to prevent the electrical short circuit between the connection plate 1230 and the heat dissipator 1400. The heat dissipator 1400 may receive from the light source module 1200 and heat from the power supply 1600, and dissipate the heat.

The holder 1500 closes a receiving groove 1719 of the insulating portion 1710 of the inner case 1700. Accordingly, the power supply 1600 which is accommodated in the insulating portion 1710 of the inner case 1700 may be hermetically sealed. The holder 1500 may have a guide protrusion 1510 and the guide protrusion 1501 may have a hole, through which the protrusion 1610 of the power supply 1600 passes.

The power supply 1600 processes and converts an electrical signal received from the outside and provides the processed or converted electrical signal to the light source module 1200. The power supply 1600 may be accommodated in the receiving groove 1719 of the inner case 1700 and is sealed in the inner case 1700 by the holder 1500. The power supply 1600 may include a protrusion 1610, a guide portion 1630, a base 1650 and an extension portion 1670.

The guide portion 1630 may protrude from one side of the base 1650 outward. The guide portion 1630 may be inserted into the holder 1500. A plurality of parts may be disposed on one surface of the base 1650. The plurality of parts may include an AC/DC converter for converting an AC voltage received from an external power source into a DC voltage, a driving chip for controlling driving of the light source module 1200, and an electrostatic discharge (ESD) protection device for protecting the light source module 1200, etc., without being limited thereto.

The extension portion 1670 may protrude from the other side of the base 1650 outward. The extension portion 1670 may be inserted into a connection portion 1750 of the inner case 1700 and may receive an electrical signal from the outside. For example, the width of the extension portion 1670 may be equal to or less than that of the connection portion 1750 of the inner case 1700. One end of each of a "positive (+) wire" and a "negative (−) wire" may be electrically connected to the extension portion 1670 and the other end thereof may be electrically connected to the socket 1800.

The inner case 1700 may include a molding portion provided therein along with the power supply 1600. The molding portion is formed by hardening molding liquid and serves to fix the power supply 1600 within the inner case 1700.

Figure 11:
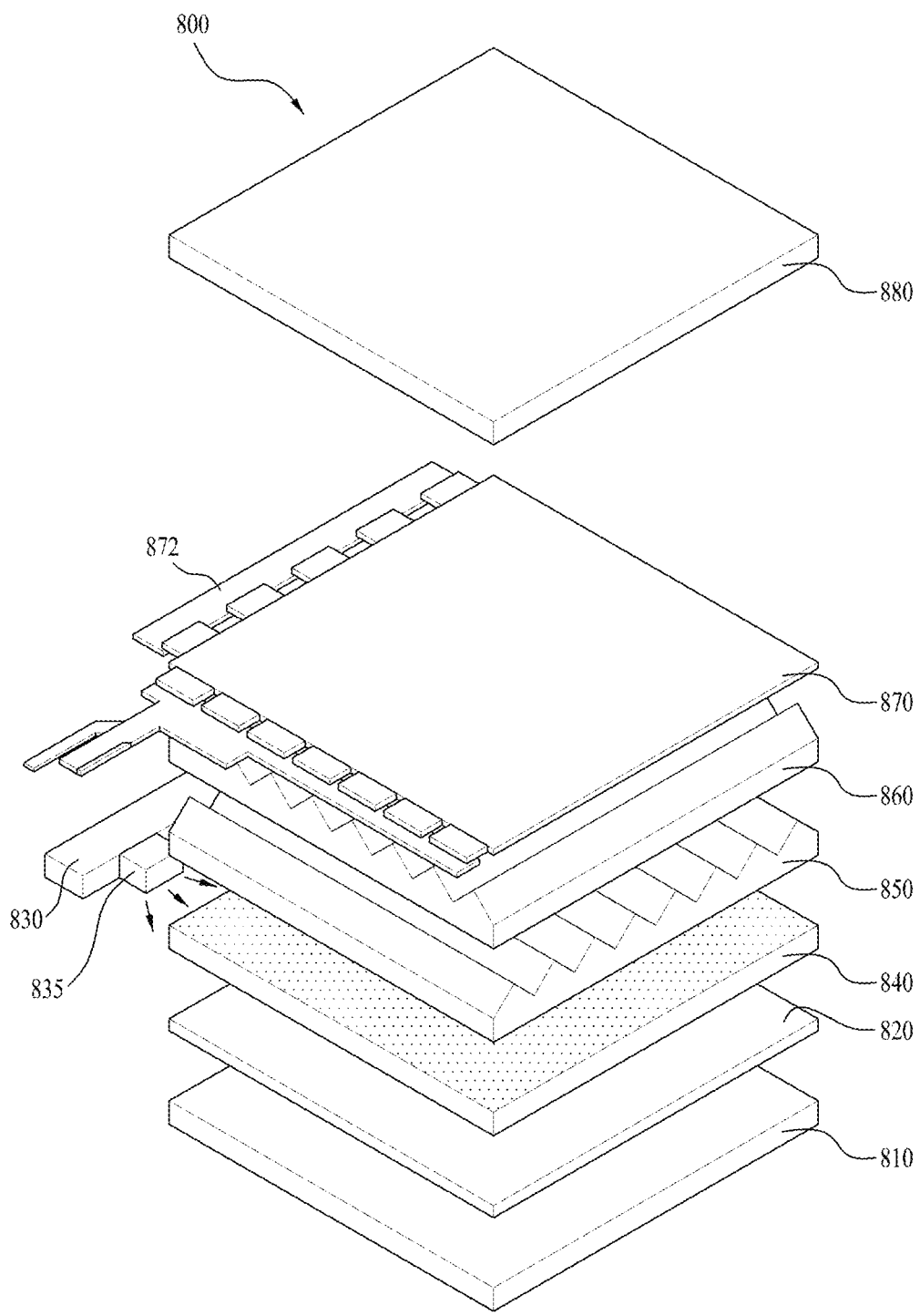
FIG. 11 is a view showing a display apparatus according to an embodiment.

FIG. 11 is a view showing a display apparatus 800 according to an embodiment.

Referring to FIG. 11, the display apparatus 800 may include a bottom cover 810, a reflective plate 820 disposed on the bottom cover 810, light emitting modules 830 and 835 for emitting light, a light guide plate 840 disposed in front of the reflective plate 820 to guide light emitted from the light emitting modules 830 and 835 to the front side of the display apparatus, an optical sheet including prism sheets 850 and 860 disposed in front of the light guide plate 840, a display panel 870 disposed in front of the optical sheets, an image signal output circuit 872 connected to the display panel 870 to supply an image signal to the display panel 870, and a color filter 880 disposed in front of the display panel 870. The bottom cover 810, the reflective plate 820, the light emitting modules 830 and 835, the light guide plate 840 and the optical sheets may configure a backlight unit.

The light emitting module may include semiconductor device packages 835 mounted on a substrate 830. As the substrate 830, a printed circuit board (PCB), etc. may be used. The semiconductor device package 835 may be the above-described embodiment.

The bottom cover 810 may accommodate the elements of the display apparatus 800. In addition, the reflective plate 820 may be provided as a separate element as shown in the figure or may be provided by coating the front surface of the bottom cover 810 or the rear surface of the light guide plate 840 with a material having high reflectivity.

The reflective plate 820 may be formed of a material having high reflectivity and can be used as an ultra-thin type and may be formed of polyethylene terephtalate (PET).

In addition, the light guide plate 830 may be formed of polymethylmethacrylate (PMMA), polycarbonate (PC) or polyethylene (PE).

The first prism sheet 850 is formed by applying a light-transmitting and elastic polymer to a surface of a support film. The polymer may have a prism layer in which a plurality of 3D structures is repeatedly formed. Here, the structures may be provided as a stripe pattern in which ridges and valleys are repeatedly formed, as shown in the drawing.

In addition, the direction of ridges and valleys on one surface of the support film of the second prism sheet 860 may be perpendicular to the direction of the ridges and valleys on one surface of the support film in the first prism sheet 850, in order to uniformly disperse light received from the light emitting module and the reflective sheet to the entire surface of the display panel 1870.

Although not shown, a diffusion sheet may be disposed between the light guide plate 840 and the first prism sheet 850. The diffusion sheet may be formed of polyester- and polycarbonate-based materials and may maximize the incidence angle of light received from the backlight unit through refraction and scattering. The diffusion sheet may include a support layer including a light diffusing agent and first and second layers formed on a light exit surface (first prism sheet direction) and a light incidence surface (reflective sheet direction) and not including the diffusing agent.

In the embodiment, the diffusion sheet, the first prism sheet 850 and the second prism sheet 860 configure an optical sheet. The optical sheet may be formed of other combinations, for example, a microlens array, a combination of a diffusion sheet and a microlens array or a combination of one prism sheet and a microlens array.

As the display panel 870, a liquid crystal display panel may be disposed. Further, in addition to the liquid crystal display panel, other kinds of display devices requiring light sources may be provided.

The semiconductor device according to the embodiment may be a laser diode. The laser diode may include the first conductive-type semiconductor layer, the active layer and the second conductive-type semiconductor layer of the above-described structure, similarly to the light emitting device.

For example, the semiconductor device according to the embodiment may be a photodetector. Such a photodetector includes a (silicon or selenium) photocell, a (cadmium sulfide or cadmium selenide) photoconductive device, a photodiode (e.g., a PD having a peak wavelength in a visible blind spectral region or a true blind spectral region), a phototransistor, a multiplier phototube, a phototube (vacuum or gas-filled) or an IR (infrared) detector, without being limited thereto.

In addition, the semiconductor device according to the embodiment is not necessarily formed of a semiconductor and may further include a metal material in some cases. For example, a semiconductor device such as a light emitting device may be implemented using at least one of Ag, Al, Au, In, Ga, N, Zn, Se, P or As or may be implemented using a semiconductor material doped with a p-type or n-type dopant or an intrinsic semiconductor material.

Features, structures and effects and the like described association with the embodiments above are incorporated into at least one embodiment of the present disclosure, but are not limited to only one embodiment. Furthermore, features, structures and effects and the like exemplified associated with respective embodiments can be implemented in other embodiments by combination or modification by those skilled in the art. Therefore, contents related to such combinations and modifications should be construed as falling within the scope of the present disclosure.

INDUSTRIAL APPLICABILITY

The embodiments may be used for semiconductor devices capable of securing reliability and suppressing increase in operating voltage.

The invention claimed is:

1. A semiconductor device comprising:
a substrate; and
a light emitting structure disposed on the substrate,
wherein the light emitting structure comprises:
a first conductive-type semiconductor layer disposed on the substrate;
a second conductive-type semiconductor layer disposed on the first conductive-type semiconductor layer;
an active layer disposed between the first conductive-type semiconductor layer and the second conductive-type semiconductor layer; and
a first electrode disposed on the first conductive type semiconductor layer,
wherein the light emitting structure includes:
a first region which is a portion of the first conductive-type semiconductor layer, wherein the first region is located below a lower surface of the active layer and has a step difference with an upper surface of the second conductive-type semiconductor layer; and
an inclined portion is disposed between an upper surface of the first region and an upper surface of the second conductive-type semiconductor layer,
wherein the inclined portion includes a first edge which is in contact with the upper surface of the second conductive-type semiconductor layer and a second edge which is in contact with the upper surface of the first region of the first conductive-type semiconductor layer,
wherein a ratio of a first length to a second length is 1:0.87 to 1:4.26,
wherein the first length is a length between the first edge and the second edge in a horizontal direction, the second length is a length between the first edge and the second edge in a vertical direction, and the horizontal direction and the vertical direction are perpendicular to each other and the vertical direction is a direction from the first conductive-type semiconductor layer to the second conductive-type semiconductor layer,
wherein the first edge is one end of the inclined portion and the second edge is the other end of the inclined portion,
wherein the first electrode is disposed on the upper surface of the first region of the first conductive-type semiconductor layer; and
wherein the first length is 0.47 µm to 1.15 µm, and the second length is 1 µm to 2 µm.

2. The semiconductor device according to claim 1, wherein the first conductive-type semiconductor layer includes AlGaN, the second conductive-type semiconductor layer includes AlGaN, and the active layer includes AlGaN,
wherein an angle between the inclined portion and the upper surface of the first region at the second edge is 115° to 139°.

3. The semiconductor device according to claim 1, further comprising a passivation layer disposed on the inclined portion.

4. The semiconductor device according to claim 3, wherein the passivation layer is disposed on a side surface of the first conductive-type semiconductor layer, a side surface of the active layer, a side surface of the second conductive-type semiconductor layer, and the inclined portion.

5. The semiconductor device according to claim 3, wherein the passivation layer is formed of $SiO_2$, $SiO_x$, $SiO_xN_y$, $Si_3N_4$, or $Al_2O_3$.

6. The semiconductor device according to claim 3, wherein the passivation layer comprises a portion disposed on the upper surface of the first region of the first conductive-type semiconductor layer.

7. The semiconductor device according to claim 1, wherein the first length is 0.93 µm to 1.15 µm.

8. The semiconductor device according to claim 7, wherein an angle between the inclined portion and the upper surface of the first region at the second edge is 115° to 120°.

9. The semiconductor device according to claim 7, wherein an internal angle of the inclined portion based on an upper surface of the substrate is 60° to 65°.

10. The semiconductor device according to claim 1, wherein the first conductive-type semiconductor layer is n-$Al_yGa_{(1-y)}N$, the second conductive-type semiconductor layer is p-$Al_xGa_{(1-x)}N$, and the content y of Al in the first conductive-type semiconductor layer is 0.4 to 0.6.

11. The semiconductor device according to claim 10, wherein the content y of Al in the first conductive-type semiconductor layer is 0.4 to 0.6.

12. The semiconductor device according to claim 1, further comprising:
- a second electrode disposed on the second conductive-type semiconductor layer,
- wherein the first electrode is spaced apart from the second edge, and
- wherein the second electrode is spaced apart from the first edge.

13. The semiconductor device according to claim 12,
- wherein a distance between the second edge and the first electrode is at least 10 μm and a distance between the first edge and the second edge is at least 10 μm.

14. The semiconductor device according to claim 12, wherein a distance between the first electrode and the second electrode in the horizontal direction is 20.47 μm to 21.15 μm.

15. The semiconductor device according to claim 1,
- wherein a first internal angle of the inclined portion with respect to an upper surface of the substrate is different from a second internal angle of a first side surface with respect to the upper surface of the substrate, and the first side surface includes a side surface of the first conductive-type semiconductor layer, a side surface of the active layer and a side surface of the second conductive-type semiconductor layer, and
- wherein the first side surface is inclined with respect to the upper surface of the substrate, one end thereof is in contact with the substrate and the other end thereof is in contact with the upper surface of the second conductive-type semiconductor layer.

16. The semiconductor device according to claim 1, wherein the first conductive-type semiconductor layer, the active layer, and the second conductive-type semiconductor layer forms a light emitting structure.

17. The semiconductor device according to claim 16, wherein the light emitting structure generates ultraviolet light.

18. The semiconductor device according to claim 1, wherein an internal angle of the inclined portion based on an upper surface of the substrate is 41° to 65°.

* * * * *